(12) United States Patent
Ying et al.

(10) Patent No.: US 7,960,767 B2
(45) Date of Patent: Jun. 14, 2011

(54) SYSTEM FOR PROGRAMMABLE GATE ARRAY WITH SENSOR ARRAY

(75) Inventors: Bond Yu-Pong Ying, Corvallis, OR (US); Christopher Dean Silsby, Albany, OR (US)

(73) Assignee: Aptina Imaging Corporation, Grand Cayman (KY)

( * ) Notice: Subject to any disclaimer, the term of this patent is extended or adjusted under 35 U.S.C. 154(b) by 1290 days.

(21) Appl. No.: 11/250,323

(22) Filed: Oct. 15, 2005

(65) Prior Publication Data

US 2007/0085920 A1   Apr. 19, 2007

(51) Int. Cl.
*H01L 23/52* (2006.01)

(52) U.S. Cl. ............ 257/292; 257/209; 257/E27.131; 438/129

(58) Field of Classification Search .......... 257/59, 257/72, 291, 292
See application file for complete search history.

(56) References Cited

U.S. PATENT DOCUMENTS

| | | | |
|---|---|---|---|
| 6,614,483 B1 | 9/2003 | Lee et al. | |
| 6,837,431 B2 | 1/2005 | Carlson et al. | |
| 6,989,589 B2 * | 1/2006 | Hammadou et al. | 257/685 |
| 7,235,835 B2 * | 6/2007 | Nagano et al. | 257/296 |
| 2002/0136044 A1 * | 9/2002 | Werner et al. | 365/45 |
| 2003/0042930 A1 * | 3/2003 | Pileggi et al. | 326/41 |
| 2003/0057359 A1 * | 3/2003 | Webster | 250/216 |
| 2004/0041219 A1 * | 3/2004 | Chao et al. | 257/431 |

* cited by examiner

*Primary Examiner* — Benjamin P Sandvik
(74) *Attorney, Agent, or Firm* — Ratner Prestia

(57) ABSTRACT

The present invention provides providing a substrate, forming a sensor array on the substrate, forming a structured array of uncommitted logic surrounding the sensor array on the substrate, and providing electrical interconnects to the structured array of uncommitted logic, wherein the structured array of uncommitted logic forms functions that support the operation of the sensor array.

20 Claims, 3 Drawing Sheets

SYSTEM FOR PROGRAMMABLE GATE ARRAY WITH SENSOR ARRAY

BACKGROUND ART

The present invention relates generally to programmable gate array systems, and more particularly to a system for programmable gate array with active pixel sensor.

CMOS image sensors are used in a variety of applications such as optical mice, to PC cameras, to security cameras. CMOS image sensors have become an important alternative to CCD's. CMOS image sensors have proven their ability to supplant CCD technology with lower cost and lower power consumption.

In many applications, the image captured by the image sensor is not simply an output for viewing. Instead, the image sensor data is used for other purposes, such as to detect movement for an optical mouse or to detect movement of objects. As one example, image sensors used in toys or machine vision devices are often used to detect movement. The image sensors also are often used to identify shapes or objects in the image field.

For these applications, significant signal processing on the images must be performed. Typically, the signal processing is performed on a separate chip by a conventional digital signal processor, a microprocessor, or other logic device, such as a field programmable gate array (FPGA) or programmable logic device (PLD).

However, the use of additional chips for signal processing is expensive. For example, a large FPGA with millions of gates may be too expensive per unit for a viable product. For pattern recognition applications, it is not necessary to use a large FPGA. Moreover, smaller gate count FPGA's are not readily available. Therefore, a standard high processing power FPGA is used, with much of the processing power of the FPGA wasted. Products must carry the burden of multiple integrated circuits that consume board space and power.

Many consumer electronic products are enabled for optical capabilities. There are cameras in cellular telephones, optical computer peripherals, such as scanners and the mouse, optical security devices and optics are becoming commonplace in automobiles. Many other applications are possible if the financial threshold, for development and manufacture, was reduced.

Thus, a need still remains for a solution that processes optical data for different applications. In view of the expanding optical applications in consumer electronics, it is increasingly essential that answers be found to these problems. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor system comprising providing a substrate forming a sensor array on the substrate, forming a structured array of uncommitted logic surrounding the sensor array on the substrate, and providing electrical interconnects to the structured array of uncommitted logic, wherein the structured array of uncommitted logic forms functions that support the operation of the sensor array.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
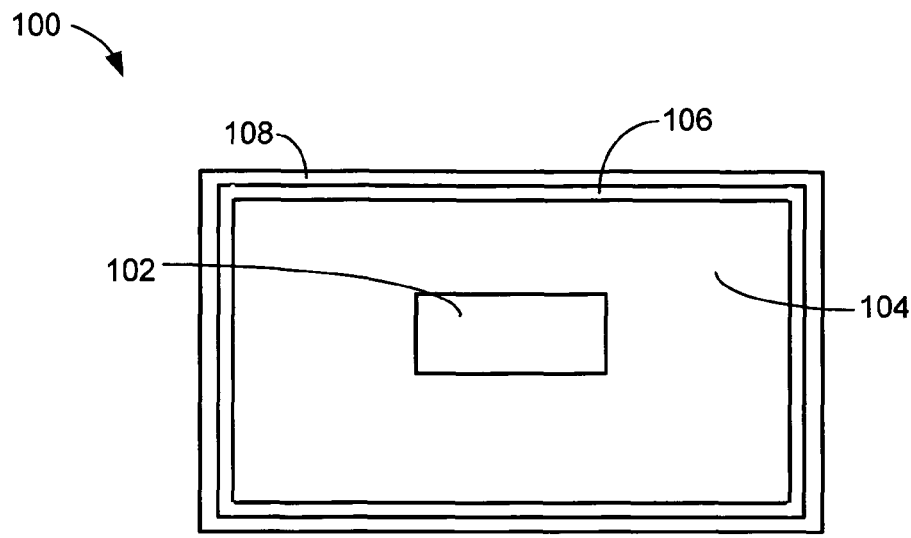
FIG. 1 is a block view of a semiconductor system for programmable gate array with a CMOS sensor array in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the exit ends of orifices as oriented downward, this arrangement in the FIGs. is arbitrary and is not intended to suggest that the delivery path should necessarily be in a downward direction. Generally, the device can be operated in any orientation. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the CMOS sensor array of the present invention regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a block view of a semiconductor system 100 for programmable gate array with a sensor array 102 in an embodiment of the present invention. The block view of the semiconductor system 100 for programmable gate array having the sensor array 102 includes a structured array of uncommitted logic 104, I/O pads 106 and a substrate 108. The sensor array 102, such as a CMOS sensor array, is an array of photo detectors and support circuitry. The sensor array 102 can be configured to support different image quality. A VGA version of the sensor array 102 has 640 pixels by 480 pixels in the array, while a six mega-pixel array is 3088 pixels by 2056 pixels. An application like a cellular telephone camera would use up to a six mega-pixel array, while a motion detector like an optical mouse would use a VGA array or less. Both of these applications can be developed in the structure of the present invention.

The sensor array 102 is positioned in the center of a structured ASIC having the structured array of uncommitted logic 104 surrounding the sensor array 102. This position allows for flexibility of the semiconductor system 100 to be used in a myriad of applications. The logic components within the structured array of uncommitted logic 104 can be considered a via programmable gate array. The structured array of uncommitted logic 104 receives metal layer and via interconnects to connect base logic to form higher level functions that are used to configure the desired function, such as microcontrollers, ROM and RAM, phase lock loops, state machines and interface protocol engines.

The I/O pads 106 surround the structured array of uncommitted logic 104. The I/O pads 106 include various functions, such as input drivers, output drivers, voltage regulators, voltage reset detectors, clock drivers, power and ground. The I/O pads 106 function can be user configured to implement different interface strategies. A simple interface could be used for an optical motion detector or a sophisticated interface like USB interface could be configured for a digital camera. The I/O pads 106 are supported by the substrate 108.

The sensor array 102 and the structured array of uncommitted logic 104 can be scaled to produce very large sophisticated applications or to produce very small simple devices. The functions can be configured by via logic, utilizing several layers of metal to connect to base components. By supplying macro configurable functions, such as sensor timing controller, image processing, auto-functions, gain control, and exposure control, the user can quickly take advantage of the flexibility of the semiconductor system 100.

Figure 2:
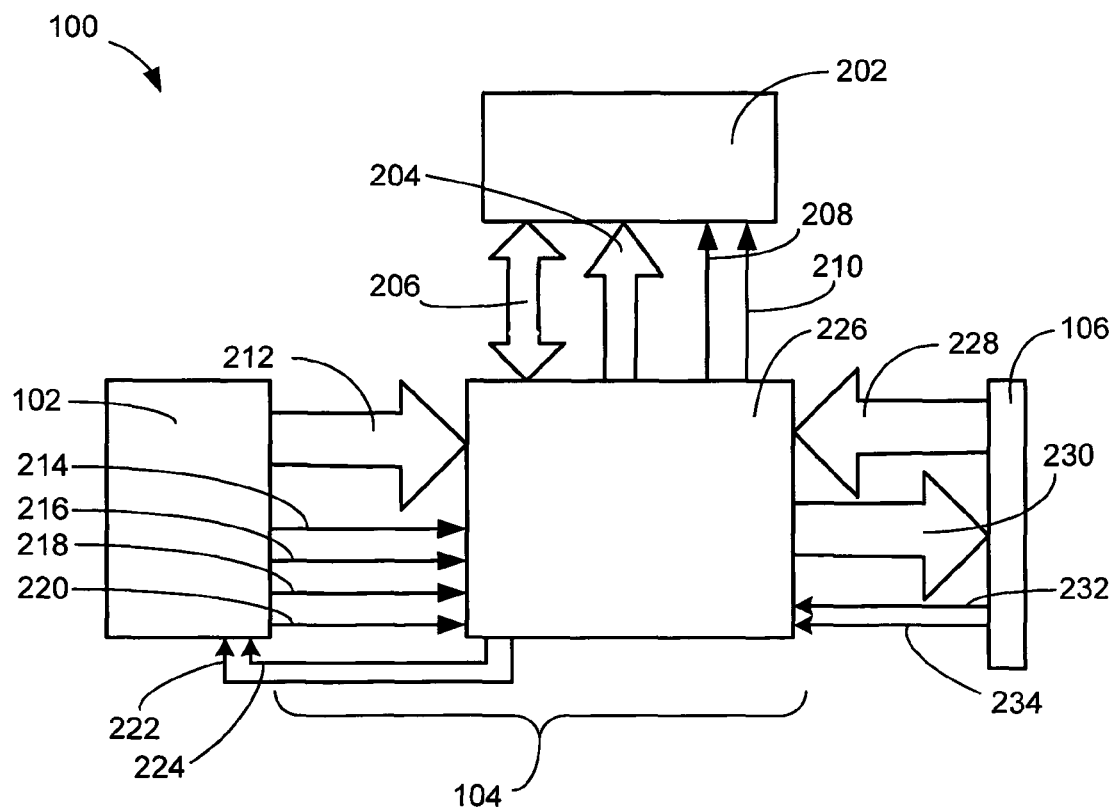
FIG. 2 is a schematic view of the semiconductor system of FIG. 1 configured as a digital camera, in an embodiment of the present invention.

Referring now to FIG. 2, there is shown a schematic of the semiconductor system 100 of FIG. 1 configured as a digital camera, in an embodiment of the present invention. The semiconductor system 100 includes the sensor array 102, the structured array of uncommitted logic 104, which is configured as a digital camera, the I/O pads 106, and a data storage RAM 202. The data storage RAM 202 is configured within the structured array of uncommitted logic 104.

The data storage RAM 202 includes numerous interface signals such as a RAM address bus 204, a RAM data bus 206, a RAM write control 208, a RAM read control 210. The sensor array 102 includes a number of interface signals such as a sensor data bus 212, a pixel clock line 214, a line valid control 216, a frame valid control 218, an output clock line 220, a serial control line 222, and a serial control clock 224. An image processor block 226, configured within the structured array of uncommitted logic 104, interfaces with the sensor array 102 and the data storage RAM 202. The image processor block 226 includes other interfaces such as a camera address bus 228, a camera data bus 230, a camera read control 232 and a camera chip select 234.

The image processor block 226 manages the transfer of image data collected by the sensor array 102. The image processor block 226 transfers gain and exposure information through the serial control line 222 and the serial control clock 224 to the sensor array 102. The sensor data bus 212 presents pixel information to the image processor block 226, under control of the pixel clock line 214, the line valid control 216, the frame valid control 218 and the output clock line 220.

The image processor block 226 moves the pixel data to the data storage RAM 202 by presenting the pixel data on the RAM data bus 206 with the storage address presented on the RAM address bus 204 and toggling the RAM write control 208. The image processor block 226 can transfer pixel data from the data storage RAM 202 to the user interface by responding to the camera address bus 228 by activating the RAM read control 210 and presenting pixel data on the camera-data bus 230, under control of the camera read control 232 and the camera chip select 234. The I/O pads 106 buffer the electrical controls of the user interface from the internal signals of the structured array of uncommitted logic 104.

Figure 3:
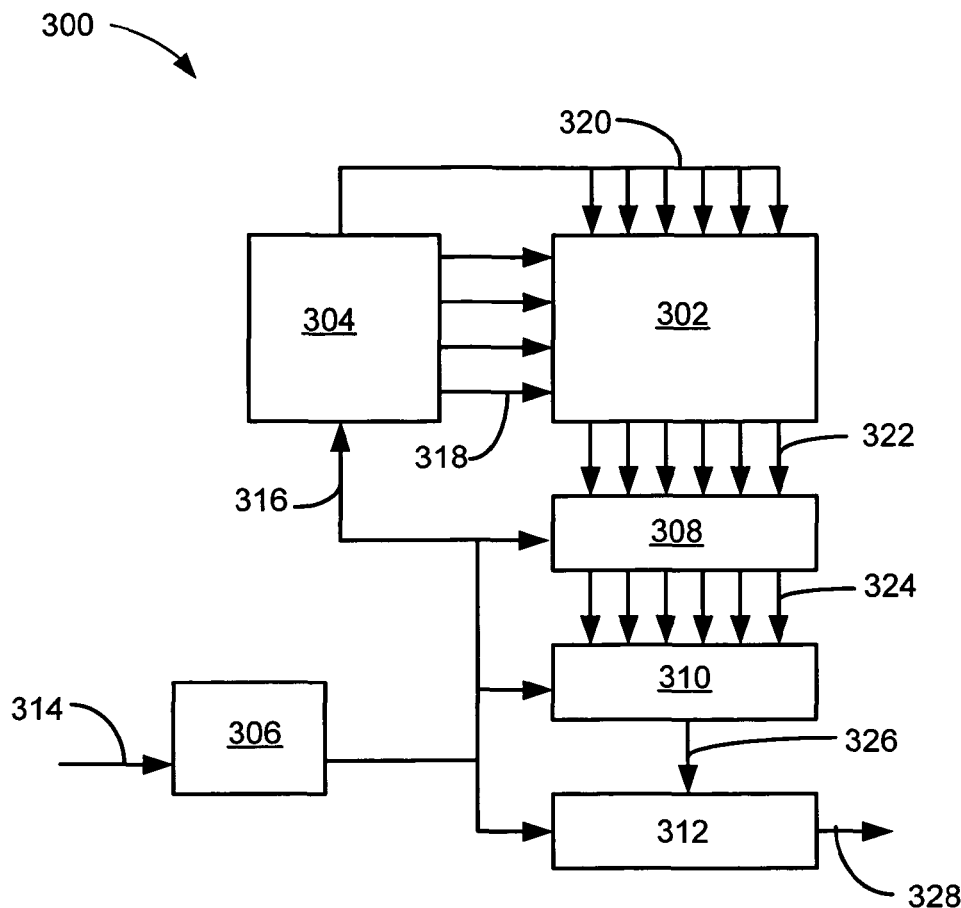
FIG. 3 is a block diagram of an active pixel sensor of the semiconductor system of FIG. 1.

Referring now to FIG. 3, therein is shown a block diagram of an active pixel sensor 300 of the semiconductor system 100 of FIG. 1. The active pixel sensor 300 is the heart of the sensor array 102 (not shown). The block diagram of the active pixel sensor 300 includes a pixel array 302, under the control of a column/row address decoder 304, which receives control signals from a sequence and timing block 306, a correlated double sampler 308, a signal multiplexer 310 and a high speed analog to digital converter 312. An address and command interface 314 instructs the sequence and timing block 306 to coordinate the flow of pixel data from the pixel array 302, through the correlated double sampler 308 and the signal multiplexer 310 to the high speed analog to digital converter 312.

The sequence and timing block 306 synchronizes the selection of pixel data from the pixel array 302 and the movement of the data through the rest of the logic. The column/row address decoder 304 receives the command information from the sequence and timing block 306 through a timing and control bus 316. The column/row address decoder 304 enables the data from a single pixel within the pixel array 302. Each pixel within the pixel array 302 typically comprises a photo detector, which could be a pinned photodiode, a transfer gate, a reset gate, a row-select gate and a source-follower amplifier. The selected pixel is at the junction of a column decode bus 318 and a row decode bus 320 activated for the current command. In some cases a single command can activate a group of pixels for data movement. The data from the selected pixel moves across a pixel data bus 322 to the correlated double sampler 308.

The correlated double sampler 308 captures a valid sample of the pixel data. It can receive adjustment information on the timing and control bus 316 that allows filter or gain information about the sample to adjust the pixel data as it is passed to a pixel output bus 324. The pixel output bus 324 gates the selected and adjusted pixel data to the signal multiplexer 310. The sequence and timing block 306 supplies gating information to the signal multiplexer 310 through the timing and control bus 316.

The selected and adjusted pixel data moves through the signal multiplexer 310 to an analog input line 326 that is sampled by the high speed analog to digital converter 312. The timing and control information for the conversion comes from the sequence and timing block 306 on the timing and control bus 316. The digital representation of the selected and adjusted pixel data is gated out of the high speed analog to digital converter 312 on a digital output bus 328. The pixel array 302 is restricted to four rows by six columns by example only. It is understood that the pixel array 302 would actually be of any suitable configuration limited only by physical space and power requirements.

Figure 4:
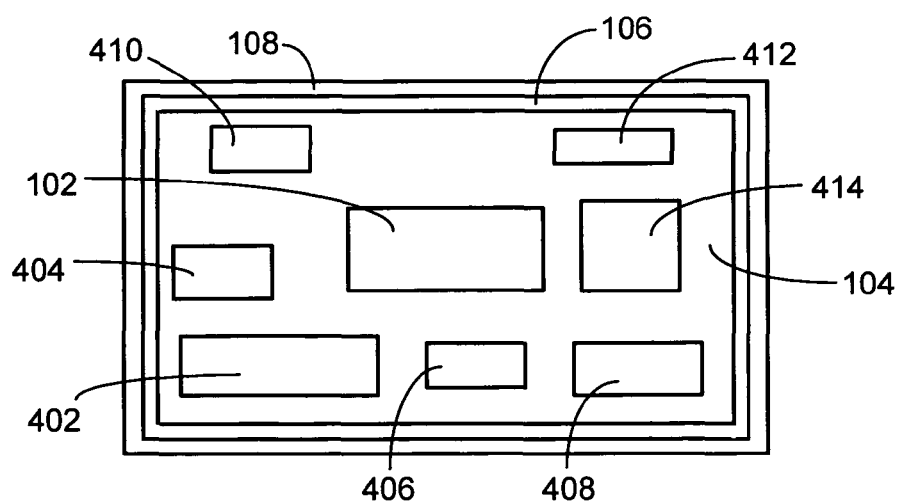
FIG. 4 is a block diagram of the semiconductor system of FIG. 1 with additional functions.

Referring now to FIG. 4, therein is shown a block diagram of the semiconductor system 100 of FIG. 1 with additional functions. The semiconductor system 100 includes the sensor array 102, the structured array of uncommitted logic 104, the I/O pads 106, the substrate 108, a micro-controller 402, a controller ROM 404, a controller RAM 406, a USB interface 408, a non-volatile RAM 410, a PLL 412 and a data storage RAM 414. The structured array of uncommitted logic 104 is set-up as a via programmable gate array. This allows rapid configuration of several popular functions that can be overlaid on the structured array of uncommitted logic 104. Overlays are formed by applying metal and via interconnects to the structured array of uncommitted logic 104, wherein the structured array of uncommitted logic 104 forms functions that support the operation of the sensor array 102 and communicates to other chips through the I/O pads 106. The overlay is implemented as metal layer and via connections to existing base logic or can be programmed by an e-beam trimming process.

The sensor array 102 can be of any size, though the optimum array sizes for current applications are CIF, a 352 by 288 pixel array, VGA, a 640 by 480 pixel array and up to 6 mega-pixels, a 3088 by 2056 pixel array. As other applications are enabled the size of the sensor array 102 can be modified. If new functional blocks become popular an overlay to the existing base structure of the structured array of uncommitted logic 104 can quickly implement them. The size of the sensor array 102 is scaleable by the use of metal layers and vias or e-beam trimming or a combination of the two.

Figure 5:
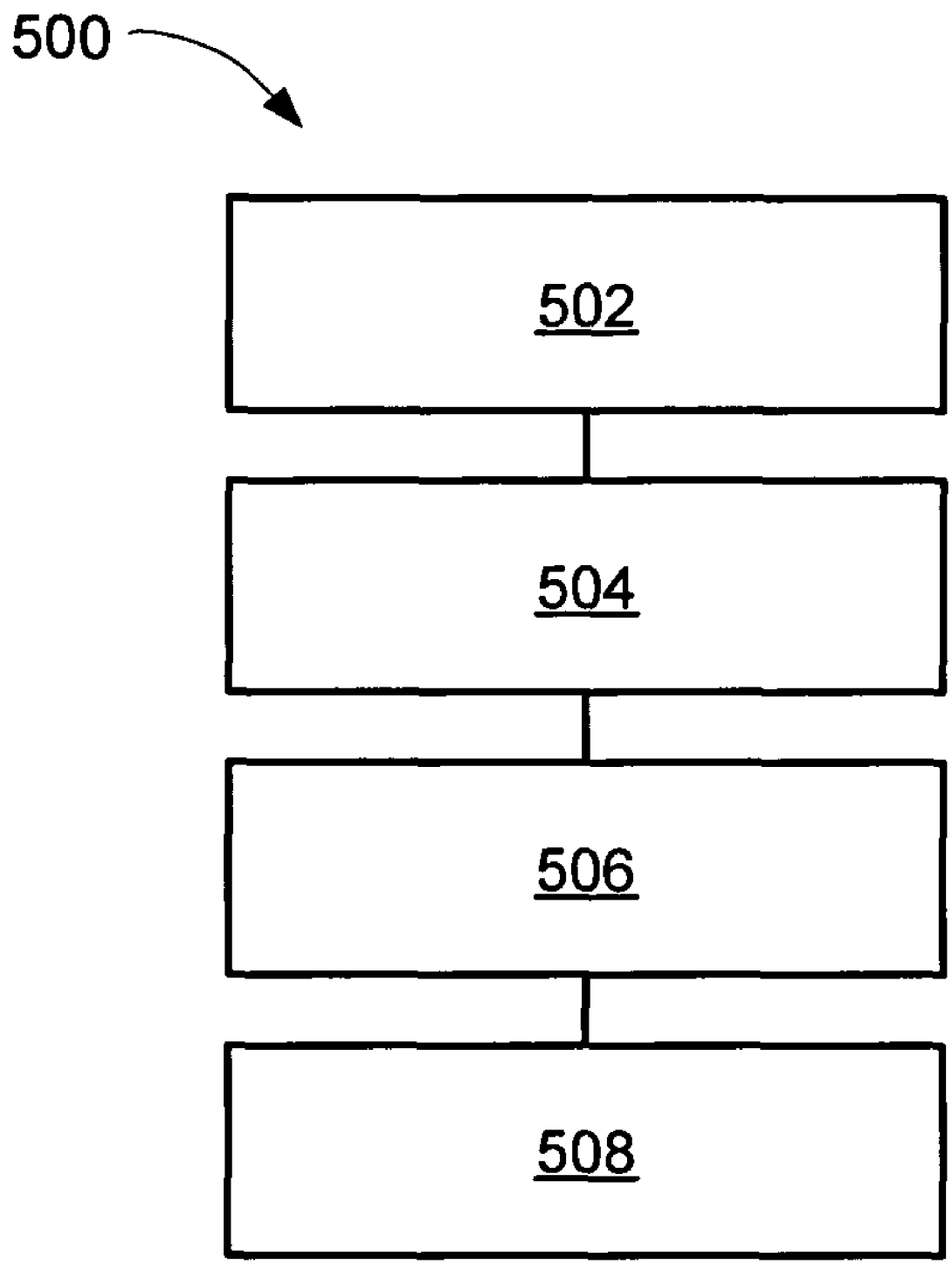
FIG. 5 is a flow chart of a semiconductor system for programmable gate array with the CMOS sensor array in an embodiment of the present invention.

Currently the most popular functional blocks support a camera system that can be implemented with the micro-controller 402, supported by the controller ROM 404 and the controller RAM 406. The PLL 412 supplies clocks to synchronize the movement of pixel data throughout the system. The USB interface 408 can be implemented through the use of the structured logic in the structured array of uncommitted logic 104 and a few overlaid structures in the I/O pads 106, though it is understood that other interfaces are possible. The non-volatile RAM 410 is used to hold system parameters. The data storage RAM 414 buffers the pixel data and allows the micro-controller 402 to manipulate the pixel data in preparation for transfer to the USB interface 408. This configuration further comprises an optical system on a chip Referring now to FIG. 5, therein is shown a flow chart of a semiconductor system 500 for programmable gate array with the sensor array 102 in an embodiment of the present invention. The system 500 includes providing a substrate in a block 502; forming a sensor array on the substrate in a block 504; forming a structured array of uncommitted logic surrounding the sensor array on the substrate in a block 506; and providing electrical interconnects to the structured array of uncommitted logic, wherein the structured array of uncommitted logic forms functions that support the operation of the sensor array in a block 508.

In greater detail, the semiconductor system 100 for programmable gate array with the sensor array 102, according to an embodiment of the present invention, is performed as follows:
1. The sensor array 102 is formed on the substrate 108. (FIG. 1)
2. The structured array of uncommitted logic 104 is formed around the sensor array 102. (FIG. 1)
3. By providing electrical interconnects to the structured array of uncommitted logic 104 higher level functions are formed to support the movement of data from the digital output bus 328 to the USB interface 408. (FIG. 4)

It has been discovered that the present invention thus has numerous aspects. It has been discovered that a programmable gate array including the sensor array can be a great benefit to the optical device industry. It allows rapid, low cost implementation of new devices or algorithms that would be out of the financial reach of small companies.

An aspect is that the present invention enables rapid development of new optical devices with low cost. The ability to rapidly configure optics based devices and evaluate their performance is a great benefit to the development of new low cost optical applications. Rapid configurations greatly accelerate debug of the device and the system. Also, rapid configuration provides inventory control by product based on a common basic design and configured later. This aspect helps companies meet market demands while minimizing expenses.

Another aspect is the ability to scale the design to produce a simple motion detector or a full digital camera from the same structured array of uncommitted logic.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the system for programmable gate array with sensor array method and apparatus of the present invention furnish important and heretofore unknown and unavailable solutions, capabilities, and functional advantages for the optical device industry. The resulting processes and configurations are straightforward, cost-effective, uncomplicated, highly versatile and effective, can be implemented by adapting known technologies, and are thus readily suited for efficiently and economically manufacturing optical devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method of forming a semiconductor device comprising the steps of:
    providing a substrate;
    forming a sensor array on the substrate, the sensor array including a column/row address decoder, a pixel array, a correlated double sampler and an analog to digital converter; and
    forming a structured array of uncommitted logic surrounding the sensor array on the substrate;
    wherein the structured array of uncommitted logic is configurable to define functions that support the operation of the sensor array.

2. The method in claim 1 wherein forming the sensor array on the substrate further comprises forming an active pixel sensor.

3. The method in claim 1 wherein forming the structured array of uncommitted logic, on the substrate, surrounding the sensor array further comprises forming a gate array.

4. The method in claim 1 including providing electrical interconnects to the structured array of uncommitted logic by applying metal layers and vias.

5. The method in claim 1 further comprising providing I/O pads, on the substrate, surrounding the sensor array and the structured array of uncommitted logic.

6. A method for forming a semiconductor device comprising the steps of:
  providing a substrate;
  forming a sensor array, further comprising forming an active pixel sensor on the substrate, the sensor array including a column/row address decoder, a pixel array, a correlated double sampler and an analog to digital converter; and
  forming a structured array of uncommitted logic surrounding the sensor array on the substrate;
  wherein the structured array of uncommitted logic is configurable to define functions that support the operation of the sensor array.

7. The method in claim 6 wherein forming the structured array of uncommitted logic, on the substrate, surrounding the sensor array further comprises forming a gate array.

8. The method in claim 6 further comprising forming I/O pads, on the substrate, surrounding the sensor array and the structured array of uncommitted logic.

9. The method in claim 6 wherein forming the active pixel sensor further comprises forming a pixel array.

10. The method in claim 6 wherein forming the sensor array as an optical sensor forms an optical system on a chip.

11. A semiconductor system comprising:
  a substrate;
  a sensor array on the substrate, the sensor array including a column/row address decoder, a pixel array, a correlated double sampler and an analog to digital converter; and
  a structured array of uncommitted logic surrounding the sensor array on the substrate;
  wherein the structured array of uncommitted logic is configurable to define functions that support the operation of the sensor array.

12. The system in claim 11 wherein the sensor array on the substrate further comprises a pixel array.

13. The system in claim 11 wherein a structured array of uncommitted logic, on the substrate, surrounding the sensor array further comprises a gate array.

14. The system in claim 11 further comprising:
  base logic circuits; and
  electrical interconnects on the structured array of uncommitted logic that comprise metal layers and vias connecting the base logic circuits to form the functions that support the operation of the sensor arrays.

15. The system in claim 11 further comprising I/O pads, on the substrate, surrounding the sensor array and the structured array of uncommitted logic.

16. The system in claim 11 wherein the sensor array further comprises a sequence and timing block, and a signal multiplexer.

17. The system in claim 11 further comprises having a phase locked loop (PLL) for synchronizing the movement of pixel data within a chip.

18. The system in claim 11 wherein the structured array of uncommitted logic further comprises a micro-controller system configuration for managing movement of pixel data.

19. The system in claim 11 wherein the sensor array, on the substrate further comprises a scalable array size by the use of at least one of metal layers and vias or e-beam trimming.

20. The system in claim 11 further wherein the sensor array is an optical sensor for configuring an optical system on a chip.

* * * * *